United States Patent
Smith, III

(10) Patent No.: US 10,314,199 B2
(45) Date of Patent: Jun. 4, 2019

(54) CONDUITLESS, LIQUID PHASE, INTERNAL CIRCULATION, IMMERSION COOLING SYSTEM

(71) Applicant: F Clay Smith, III, Mesa, AZ (US)

(72) Inventor: F. Clay Smith, III, Mesa, AZ (US)

( * ) Notice: Subject to any disclaimer, the term of this patent is extended or adjusted under 35 U.S.C. 154(b) by 166 days.

(21) Appl. No.: 15/676,960

(22) Filed: Aug. 14, 2017

(65) Prior Publication Data

US 2019/0053402 A1   Feb. 14, 2019

(51) Int. Cl.
| | |
|---|---|
| H01L 23/473 | (2006.01) |
| H05K 7/20 | (2006.01) |
| H01L 23/44 | (2006.01) |
| G06F 1/20 | (2006.01) |
| F28F 3/04 | (2006.01) |

(52) U.S. Cl.
CPC ........... *H05K 7/20236* (2013.01); *G06F 1/20* (2013.01); *H01L 23/44* (2013.01); *H05K 7/20827* (2013.01); *F28F 3/04* (2013.01); *G06F 2200/201* (2013.01); *H01L 23/473* (2013.01)

(58) Field of Classification Search
CPC ........... H05K 7/20236; H05K 7/20827; H01L 23/44; H01L 23/473; H01L 2924/0002; H01L 2924/00; G06F 1/20; G06F 2200/201; F28F 3/04
See application file for complete search history.

(56) References Cited

U.S. PATENT DOCUMENTS

| | | | | |
|---|---|---|---|---|
| 4,037,650 A | * | 7/1977 | Randall | C09K 5/063 165/10 |
| 5,048,599 A | * | 9/1991 | Tustaniwskyj | F24D 19/083 165/104.32 |
| 7,161,456 B2 | * | 1/2007 | Knox | H01F 27/385 336/90 |
| 7,724,517 B2 | * | 5/2010 | Attlesey | G06F 1/181 361/679.53 |
| 8,081,054 B2 | * | 12/2011 | Guentert, III | H01F 27/12 336/58 |
| 9,258,926 B2 | * | 2/2016 | Smith | H05K 7/20818 |
| 9,261,308 B2 | * | 2/2016 | Campbell | F28F 3/048 |
| 9,992,914 B2 | * | 6/2018 | Best | H05K 7/20763 |
| 2003/0151892 A1 | * | 8/2003 | Kondo | G06F 1/203 361/679.53 |
| 2007/0099049 A1 | * | 5/2007 | Knight | H01M 8/04007 429/414 |

(Continued)

*Primary Examiner* — Michael C Zarroli
(74) *Attorney, Agent, or Firm* — J. Adele Plotkin

(57) ABSTRACT

A two chamber immersion cooling tank for cooling at least one heat producing electronic component is described. In one sub-chamber, the at least one electronic component is appropriately secured in the tank which is filled with dielectric fluid that maintains liquid form throughout the cooling procedure. In the circulation path, prior to the component[s], is at least one cross-flow wave inducer. In the second sub-chamber is a secondary heat exchanger which is set up so that all warmed dielectric liquid leaving the electronic component[s] must flow through the secondary heat exchanger in the second sub-chamber.

Flow may be vertical or horizontal with respect to the effects of gravity. If a hermetically sealed top is present, orientation can be variable and the system may be used in mobile field or vehicle applications.

20 Claims, 2 Drawing Sheets

(56) References Cited

U.S. PATENT DOCUMENTS

| | | | |
|---|---|---|---|
| 2007/0213000 A1* | 9/2007 | Day | H05K 7/20754 454/184 |
| 2011/0132579 A1* | 6/2011 | Best | H05K 7/20763 165/104.31 |
| 2014/0321053 A1* | 10/2014 | Donnelly | H05K 7/20236 361/691 |
| 2017/0223870 A1* | 8/2017 | Smith | F25D 3/00 |

* cited by examiner

CONDUITLESS, LIQUID PHASE, INTERNAL CIRCULATION, IMMERSION COOLING SYSTEM

CROSS-REFERENCE TO RELATED APPLICATIONS

Not applicable

STATEMENT REGARDING FEDERALLY SPONSORED RESEARCH OR DEVELOPMENT

Not applicable

REFERENCE TO A SEQUENCE LISTING, A TABLE, OR A COMPUTER PROGRAM LISTING COMPACT DISC APPENDIX

Not applicable

BACKGROUND

As society uses more and more electronic equipment, the problems associated with the technology become challenges for maintenance. For instance, many components of the electronics are heat producers. Excessive heat can damage the equipment. Cooling of the entire electronics equipment is cumbersome and can be energy wasteful with cooling of components that are not self-heating. Hence separation of the heat producing components from the rest of the equipment while still in working contact can be helpful. The heat producing components can then be set up in a cooling device which can maintain the optimal temperature range for the working of the components as they are in use such as with gaming technology.

Many such devices have been developed. Some use two phase cooling such as air and water or liquid/vapor transitioning coolant (e.g. U.S. Pat. Nos. 8,369,091, 8,179,677, 6,906,919, 5,285,347). Most use pipe systems to transfer the primary coolant along paths where contact with heat transferring material [thermal interface material TIM] can bleed the heat from the components to the coolant (e.g. U.S. Pat. No. 7,667,969). Another slightly different approach is immersion cooling. For those systems using fluid circulation, the circulation loop tends to be out of the tank for cooling of warmed primary coolant and return to the tank after cooling (e.g. U.S. Pat. No. 7,983,040).

As would be expected, sensors are used as needed to provide thermostatic control [e.g. 20120111034]. For instance, rate of flow of the coolant might be varied. Related computer programmed control of the necessary processes could then automate the system.

However, to date, no system has used liquid dielectric primary coolant in totally internal circulation with a conduitless flow path and without TIM. The present invention simplifies immersion cooling to such a system with a unique physical layout of the tank and its constituents which includes at least one cross-flow circulation inducer [e.g. pump] and secondary cooling of all of the warmed primary coolant within the tank set up. In some embodiments, additional circulation impetus comes from the natural rising of warmed liquid and sinking of cooled liquid.

SUMMARY

An immersion cooling tank for cooling at least one heat producing electronic component is described. In a first embodiment, a partial divider is attached at least to two sides of a tank but not completely to the top nor the bottom and defines two sub-chambers of the tank. The two sides for attachment may be opposite or adjacent to each other. Gaps at the top and bottom between the divider and the top or bottom respectively allow for passage of the liquid contained in the tank. In one sub-chamber, the at least one electronic component is appropriately secured in the tank which is filled with dielectric fluid that maintains liquid form throughout the cooling procedure. Beneath the component[s] is at least one cross-flow wave inducer.

In the second sub-chamber is a secondary heat exchanger which is set up so that all warmed dielectric liquid leaving the electronic component[s] must flow through the secondary heat exchanger. Optionally, a mechanical filter may be placed prior to the secondary heat exchanger. If so, the filter is set up so that all of the dielectric liquid flows through the filter prior to flowing through the secondary heat exchanger.

Flow is caused in part by the heat differentials in the sub-chambers and in part by the cross-flow wave inducer function. Cooled dielectric liquid sinks to the tank bottom after leaving the secondary heat exchanger. It then flows into the first sub-chamber by virtue of the function of the cross-flow wave inducer[s]. The flow continues upward in the first sub-chamber cooling the at least one component as it flows. The cycle then repeats with warmed dielectric liquid rising and flowing into the second sub-chamber. In this embodiment, the flow is up and down with respect to the effects of gravity.

A second embodiment would have the at least one cross-flow wave inducer placed at ninety degrees to the previous configuration. Hence the circulation would then be in a horizontal plane with respect to the effects of gravity. This could be accomplished by using the apparatus of the first embodiment turned onto an appropriate side with the original top having a sealed cover lid containing appropriate passageways for attachments to any components, cross-flow inducers, heat exchange equipment, etc. as needed. Alternatively it could be built in the second configuration with the topmost side becoming the open 'top' with a sealing cover.

Either embodiment when used with the sealed cover lid can be made to be mobile for field work and carried at any convenient angle with respect to the effects of gravity. For instance the device could be transported in a vehicle or carried in a backpack. However it is preferred for better efficiency to have the cross-flow inducer in the lower portion of the device at whatever orientation it might be.

FIGURES

DETAILED DESCRIPTION

Figure 1:
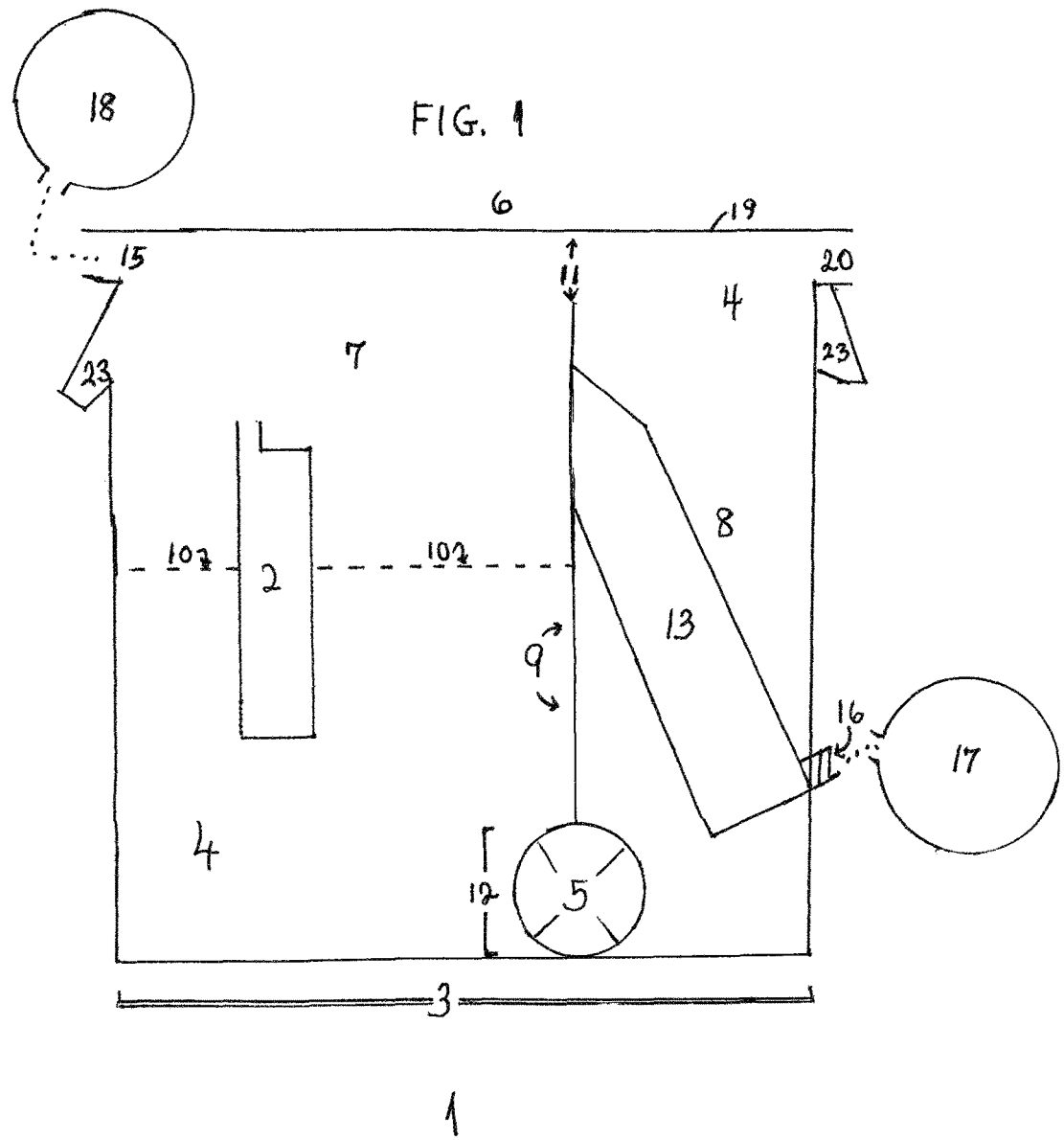
FIG. 1 depicts a side view of one embodiment of the inventive cooling immersion tank with vertical circulation.

An immersion cooling system [1] having a tank [3] for cooling at least one heat producing electronic component [2] is described. The tank has four sides, a top [6], an optional top cover and a bottom. In a first embodiment, as seen in FIG. 1, a partial divider [9] is attached at least to two sides of the tank but not completely to the top nor the bottom and defines two sub-chambers of the tank. The two sides for attachment may be opposite or adjacent to each other. Hence the divider defines a top gap [11] and a bottom gap [12]

between the two chambers to allow for circulation i.e. the gaps at the top and bottom between the divider and the top or bottom respectively allow for passage of the liquid contained in the tank. In one sub-chamber [7], the at least one electronic component [2] is secured by an effective means to secure [10] the electronic component[s] in the tank [3] which is filled with dielectric fluid coolant [4] that maintains liquid form throughout the cooling procedure. A preferred dielectric fluid would be biodegradable, non-toxic, and basically inert. Beneath the component[s] is at least one cross-flow wave inducer pump [5].

A passageway [15] at the top of the tank allows for ingress and egress of attachments needed for the electronic components and power source. These attachments allow for communication between the active electronics system[s] [18] and their heat producing component[s]. Alternatively the passageway[s] [20] go through a top cover [19]. All passageways and the top may be sealed hermetically in order to allow for safe and spill free mobility. However the cooling system works well in a top open configuration. In such a case, an optional spill catch gutter [23] may be useful to be included in the construction. If so, the gutter will direct all spill back into the tank.

In the second sub-chamber [8] is a secondary heat exchanger [13] which is set up so that all warmed dielectric liquid leaving the electronic component[s] must flow through the secondary heat exchanger. Optionally, a mechanical filter [14] may be placed prior to the secondary heat exchanger. If so, the filter is set up so that all the dielectric liquid flows through the filter prior to flowing through the secondary heat exchanger. As with the electronic components, there will be a passageway [16] for the ingress and egress of attachments to the secondary heat exchanger such as for secondary coolant to and from a secondary coolant cooling location [17]. A passageway for attachments to the pump is also present. It may be a separate passageway or combined with one of the others. Similarly power connections may be through any existing passageways or via a dedicated passageway.

Flow is caused in part by the heat differentials in the sub-chambers and in part by the cross-flow wave inducer [5] function. Cooled dielectric liquid sinks to the tank bottom after leaving the secondary heat exchanger. It then flows into the first sub-chamber by virtue of the function of the cross-flow wave inducer[s]. The flow continues upward in the first sub-chamber cooling the at least one component as it flows. The cycle then repeats with warmed dielectric liquid rising and flowing into the second sub-chamber. In this embodiment, the flow is up and down with respect to the effects of gravity.

A preferred, but not required, power source for the power consuming components of the system is a 24 V DC power supply. Sensors, motherboards, and other components for related computer programmed control to automate the system can be distributed within the tank as needed on or within the walls, the divider, the lid, etc. Uses for the above vertical configuration include, among others, PC gaming, PC appliances and computer work stations.

Figure 2:
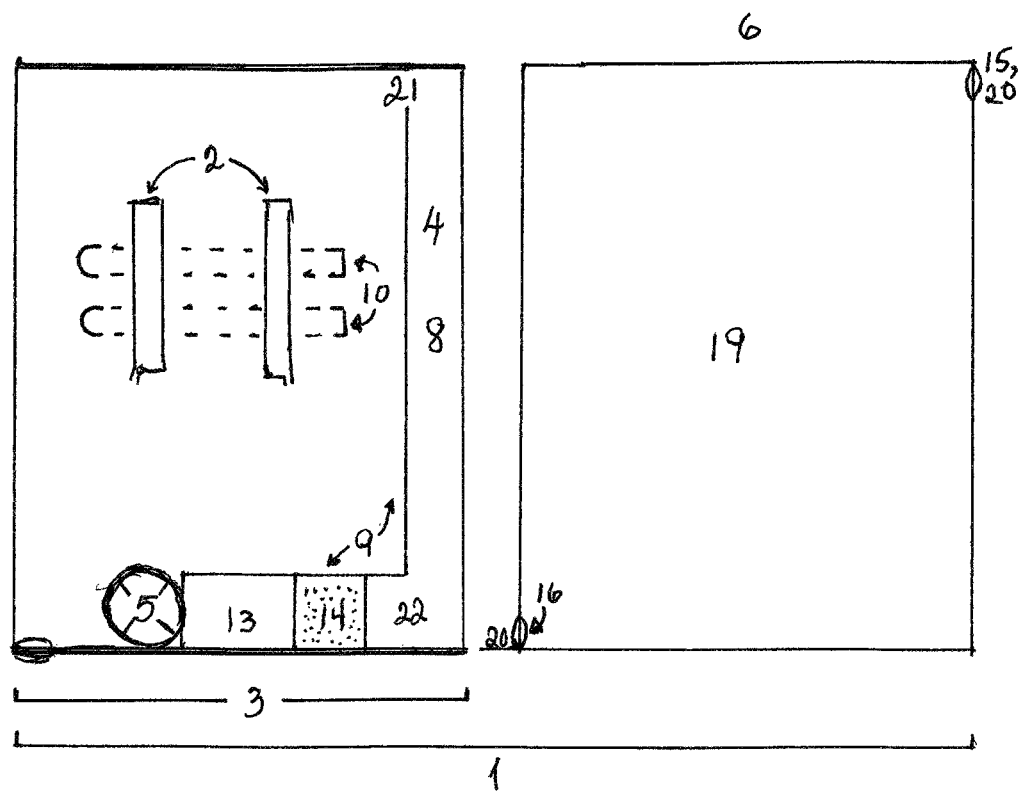
FIG. 2 depicts a top down view of a second embodiment of the inventive cooling immersion tank with horizontal circulation.

A second embodiment, such as in FIG. 2, would have the at least one cross-flow wave inducer [5] placed so that the circulation would then be in a horizontal plane with respect to the effects of gravity. This could be accomplished by using the apparatus of the first embodiment turned onto an appropriate side with the original top having a sealed cover lid containing appropriate passageways for attachments to any components, cross-flow inducers, heat exchange equipment, etc. as needed. Alternatively it could be built in a configuration such as the second configuration, seen in FIG. 2, with the topmost side of the vertical configuration becoming the open 'top' [6] with a sealing cover [19].

As in the first embodiment, there are two subchambers [7,8] filled with liquid dielectric [4]. In the first subchamber [7] the at least one heat producing electronic component [2] is effectively secured by a means to do so [10]. At least one pump [5] assisted dielectric [4] flow cools the components and circulates from the first subchamber [7] through side gap [21] to the second subchamber [8]. It then flows through optional filter [14] and secondary heat exchanger [13]. It exits the second subchamber through side gap [22] into the at least one pump in the first subchamber to then start the cycle again. Passageways [15, 20] allow for the ingress and egress of attachments as needed, and are hermetically sealed against dielectric leakage as needed. Top cover [19] may be sealed onto the tank [3] if so desired.

The subchambers may have various shapes as desired. Depicted in FIG. 2 is an L-shape subchamber in which the filter [14] and secondary heat exchanger [13] may be placed as in the first embodiment or as depicted here in the L portion adjacent to the at least one pump [5]. Uses convenient with this second embodiment include, among others: supercomputing, for a data center, HPC or other PC appliances.

Either embodiment when used with the sealed cover lid can be made to be mobile for field work and carried at any convenient angle with respect to the effects of gravity. For instance the device could be transported in a vehicle or carried in a backpack. However it is preferred for better efficiency to have the cross-flow inducer in the lower portion of the device at whatever orientation it might be.

In the preceding detailed description, reference has been made to the accompanying figures which illustrate specific embodiments of the presented invention. The system includes typical control sensors and adjustors such as a thermostat controller. Therefore these embodiments and variants thereof have been described in sufficient detail to enable those skilled in the art to practice the described invention. As would be evident to those skilled in the art, the preceding detailed description is not limited to the specifics of the embodiments described but rather is intended to cover such alternatives, modifications, and equivalents as can reasonably be included within the spirit and scope of the described invention and the appended claims.

The invention claimed is:

1. An immersion cooling system [1] for cooling at least one heat producing component [2] of active electronics systems comprising:
   a) A tank [3] filled with a dielectric liquid coolant [4];
   b) At least one pump [5] in said tank to help circulate said dielectric liquid coolant;
   c) A location in said tank at which heat producing electronics components for cooling are attached [10] securely when present with an effective means to secure;
   d) A second location within said tank for secondary heat exchange [13] from said dielectric liquid coolant to a secondary coolant;
      i) Wherein said tank comprises four sides, a top [6], and a bottom;
      ii) wherein said tank consists of a first subchamber [7] and a second subchamber [8];
      iii) wherein said first and said second subchambers are separated by a partial divider [9] attached to two of said four sides;

iv) wherein there are a top gap [11] and a bottom gap [12] between said partial divider and said top and said bottom respectively to allow for passage of said liquid coolant contained in said tank;
v) wherein said at least one pump is located at the bottom of said first subchamber to assist circulation of said liquid coolant from said second subchamber through said bottom gap, through said pump, upward past said electronic components while simultaneously cooling said electronic components, into said first subchamber by way of said top gap and through said second location;
vi) wherein said location for securely attaching said electronic components with said effective means to secure is in the first subchamber above said at least one pump;
vii) wherein said second location for said secondary heat exchange is in said second subchamber; and
viii) wherein said dielectric liquid coolant circulates into said second subchamber through said top gap and all said dielectric liquid coolant then circulates through said second location for said secondary heat exchange.

2. A cooling system as described in claim 1 wherein said pump induces a cross-flow action.

3. A cooling system as described in claim 1 further comprising a secondary heat exchanger [13] at said second location.

4. A cooling system as described in claim 3 further comprising at least one optional mechanical filter [14] through which all said dielectric liquid coolant circulates prior to reaching said secondary heat exchanger.

5. A cooling system as described in claim 1 further comprising a means [15] through which entry attachments to said electronic components can enter said tank and exit attachments from said electronic components can exit said tank.

6. A cooling system as described in claim 3 further comprising a means [16] for ingress of said secondary coolant to said secondary heat exchanger from a cooling location where said secondary coolant is cooled and a means for egress of said secondary coolant from said secondary heat exchanger to said cooling location.

7. A cooling system as described in claim 1 wherein said top is open.

8. A cooling system as described in claim 7 wherein said top further comprises a cover [19] with passageways [20] for attachments, as needed for said components, to said pump, and to said second location for said secondary heat exchanger, and wherein said cover has a means to make a leak-free seal onto said tank.

9. A cooling system as described in claim 8 wherein said tank is operable at any orientation with respect to the effects of gravity.

10. A cooling system as described in claim 8 wherein said cooling system is compact enough to be easily mobile for field work with continuous functioning.

11. An immersion cooling system [1] for cooling heat producing components [2] of active electronics systems comprising:
  a) A tank [3] filled with a dielectric liquid coolant [4];
  b) At least one pump [5] in said tank to help circulate said dielectric liquid coolant;
  c) A location in said tank at which heat producing electronics components when present for cooling are attached securely with an effective means to secure [10];
  d) A second location within said tank for secondary heat exchange [13] from said dielectric liquid coolant to a secondary coolant;
    i) Wherein said tank comprises four sides, a top [6], and a bottom;
    ii) wherein said tank consists of a first subchamber and a second subchamber;
    iii) wherein said first and second subchambers are separated by a partial divider attached to a first side and a second side of said four sides;
    iv) wherein there are a first side gap and a second side gap between said partial divider and said first side and said second side respectively to allow for passage of said liquid coolant contained in said tank;
    v) wherein said at least one pump is located at the bottom of said first subchamber to assist circulation of said liquid coolant from said second subchamber through said second side gap, through said pump, past said electronic components while simultaneously cooling said electronic components, into said first subchamber by way of said first side gap and through said second location;
    vi) wherein said location for securely attaching said electronic components is in the first subchamber receiving the flow from said at least one pump;
    vii) wherein said second location for said secondary heat exchange is in said second subchamber; and
    viii) wherein said dielectric liquid coolant circulates into said second subchamber through said first side gap and all said dielectric liquid coolant then circulates through said second location for said secondary heat exchange.

12. A cooling system as described in claim 11 wherein said pump induces a cross-flow action.

13. A cooling system as described in claim 11 further comprising a secondary heat exchanger at said second location.

14. A cooling system as described in claim 13 further comprising at least one optional mechanical filter [14] through which all said dielectric liquid coolant circulates prior to reaching said secondary heat exchanger.

15. A cooling system as described in claim 11 further comprising a means [15] through which entry attachments to said electronic components can enter said tank and exit attachments from said electronic components can exit said tank.

16. A cooling system as described in claim 13 further comprising a means [16] for ingress of said secondary coolant to said secondary heat exchanger from a cooling location where said secondary coolant is cooled and a means for egress of said secondary coolant from said secondary heat exchanger to said cooling location [17].

17. A cooling system as described in claim 11 wherein said top is open.

18. A cooling system as described in claim 17 wherein said top further comprises a cover [19] with passageways [20] for attachments as needed for said components, to said pump, and to said second location for said secondary heat exchanger, wherein said cover has a means to make a leak-free seal onto said tank.

19. A cooling system as described in claim 18 wherein said tank is operable at any orientation with respect to the effects of gravity.

20. A cooling system as described in claim 18 wherein said cooling system is compact enough to be easily mobile for field work with continuous functioning.

* * * * *